(12) United States Patent
Jang

(10) Patent No.: US 6,174,800 B1
(45) Date of Patent: Jan. 16, 2001

(54) VIA FORMATION IN A POLY(ARYLENE ETHER) INTER METAL DIELECTRIC LAYER

(75) Inventor: Syun-Ming Jang, Hsin-Chu (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/149,257

(22) Filed: Sep. 8, 1998

(51) Int. Cl.[7] .................................................. H01L 21/4763
(52) U.S. Cl. .......................... 438/629; 438/637; 437/192; 156/643
(58) Field of Search .................................. 438/629, 637; 437/192; 156/643

(56) References Cited

U.S. PATENT DOCUMENTS

| | | | |
|---|---|---|---|
| 5,115,082 | 5/1992 | Mercer et al. | 528/219 |
| 5,326,427 | * 7/1994 | Jerbic | 156/643 |
| 5,451,543 | 9/1995 | Woo et al. | 437/195 |
| 5,523,148 | 6/1996 | Afzali-Ardakami et al. | 428/260 |
| 5,565,384 | 10/1996 | Havemann | 437/228 |
| 5,658,994 | 8/1997 | Burgoyne, Jr. et al. | 525/390 |
| 5,702,981 | * 12/1997 | Maniar et al. | 437/192 |
| 5,854,130 | * 12/1998 | Yang et al. | 438/637 |

* cited by examiner

*Primary Examiner*—Richard Elms
*Assistant Examiner*—Pho Luu
(74) *Attorney, Agent, or Firm*—George O. Saile; Stephen B. Ackerman

(57) ABSTRACT

A process for removal of residual hardmask used to etch vias in low-k organic polymer dielectric layers is described. The hardmask deteriorates by developing an angular aspect or faceting along the pattern edges when used to etch organic polymer layers in an oxygen/inert gas plasma in a high density plasma etcher. The residual hardmask is removed after the via etch with an aqueous etchant to prevent subsequent bridging shorts. A protective layer, formed over the subjacent conductive layer of a material resistant to the aqueous etchant, protects the conductive layer from attack during hardmask removal. The protective layer is subsequently removed by sputter etching immediately prior to the sputter deposition of barrier metallurgy into the via opening. Residual silicon oxide hardmasks are etched in aqueous HF using a protective layer of silicon nitride or silicon oxynitride and residual silicon nitride or silicon oxynitride hardmasks are removed with $H_3PO_4$ in the presence of a silicon oxide protective layer.

10 Claims, 5 Drawing Sheets

VIA FORMATION IN A POLY(ARYLENE ETHER) INTER METAL DIELECTRIC LAYER

RELATED PATENT APPLICATION

TSMC-97-558, Ser. No. 09/268,542, F/D Mar. 15, 1999, "VIA PATTERNING FOR POLY(ARYLENE ETHER) USED AS INTER-METAL DIELECTRIC", S. M. Jang, M. H. Huang, and C. H. Yu, assigned to a common assignee.

BACKGROUND OF THE INVENTION (1) Field of the Invention

The invention relates to processes for the manufacture of semiconductor devices and more particularly to processes related to formation of vias and contacts in organic insulative layers on semiconductor wafers.

(2) Background of the Invention and Description of Previous Art

Integrated circuits(ICs) are manufactured by first forming discrete semiconductor devices within the surface of silicon wafers. A multi-level metallurgical interconnection network is then formed over the devices contacting their active elements and wiring them together to create the desired circuits. The Wiring layers are formed by first depositing an insulating layer over the discrete devices, patterning and etching contact openings into this layer, and then depositing conductive material into these openings. A conductive layer is then applied over the insulating layer which is patterned and etched to form wiring interconnections between the device contacts thereby creating a first level of basic circuitry. These basic circuits are then further interconnected by utilizing additional wiring levels laid out over additional insulating layers with via pass throughs.

The performance or speed of the integrated circuits is determined in large part by the conductance and capacitance of the metal wiring network. For many years aluminum wiring and silicon oxide inter level dielectric layers have been the norm. As device densities increase and geometries decrease, however, the RC time constraints of the interconnective wiring have become increasingly restrictive to integrated circuit performance. Thus in order to further improve performance, researchers have, in recent years, intensified their search for a metallurgy offering greater conductivity and insulative materials with lower dielectric constants.

Copper is a prominent replacement for aluminum while various organic insulators such as parylene, and arylene ether polymers, have been successfully used as low dielectric constant(low-k) replacements for silicon oxide. Low-k, when applied to insulative layers in integrated circuits, generally refers to a dielectric constant of less than about 3.5 and preferably less than about 2. Porous silica based materials such as siloxanes, aerogels and xerogels have also been implemented as ILD(inter layer dielectric) and IMD (inter-metal dielectric) layers. Fluorinated polyimides offer some improvement in dielectric constant lowering over conventional polyimides.

Low-k organic polymer dielectrics have also found use in packaging materials for integrated circuit chips. Afzali-Ardakami, et.al., U.S. Pat. No. 5,523,148 cites the lowering of dielectric constant and improvement of copper adhesion to fluorinated polycyanurate polymers and fluorinated arylene ether polymers which are impregnated into various reinforcement materials for electronic packaging structures. Preparation methods for fluorinated arylene ether polymers which have dielectric constants between 2.5 and 2.8 and have a low sensitivity to ambient humidity are cited by Mercer, et.al., U.S. Pat. No. 5,115,082. Burgoyne, et.al., U.S. Pat. No. 5,658,994 describe preparation methods for poly(arylene ether)dielectrics Films are spin coated onto silicon wafers and cured. Polymer films designated as PAE-2 and PAE-4, have dielectric constants of 2.41 and 2.42 respectively when measured at 1 MHz.

Many of the low-k dielectric materials, in particular the arylene ether based polymers, for example FLARE™ (Allied Signal Inc.) and Lo-K™2000 (Air Products and Chemicals Inc., Allentown, Pa.) exhibit patterning problems because of their low etch rate selectivities with respect to photoresist. These polymer dielectric layer materials require an oxygen based etchant chemistry for effective patterning to form contact or via openings. Etching is done by RIE (reactive ion etching) or by plasma etching. Typically an $O_2/Ar$ or $O_2/He$ etchant chemistry is used.

In order to cope with the poor etch rate selectivity of these organic low-k materials, a hardmask is used to etch the polymer layer. A layer of silicon oxide, deposited, by PECVD(plasma enhanced chemical vapor deposition) is applied over the cured polymer layer. A silicon dioxide hardmask is formed by patterning the silicon oxide layer. The $SiO_2$ hardmask can then be used to pattern the polymer dielectric layer.

Although the $O_2/Ar$ or $O_2/He$ etchant chemistry is an effective etchant for the polymer layer, problems with respect to the profile of the openings etched in the polymer layer and the etching behavior of the hardmask are encountered. Under the etching conditions which lead to bowed profiles, the hardmask profile remains essentially vertical. However, by varying the etching conditions to reduce the bowing of etched via openings in the polymer, the hardmask begins to exhibit an angular aspect similar to faceting. This is illustrated in the cross section of FIG. 1 which shows via openings 16 formed in an organic polymer IMD layer 12 to access metal conductors 18 on insulative layer 20. The metal conductors 18 are typically connected to an underlying structure(not shown) through insulating layer 20. A silicon oxide hardmask 14 has been used to etch the openings 16 with an $O_2/Ar$ plasma in an HDP(high density plasma) etcher. The via openings 16 in the polymer layer 12 have essentially vertical sidewalls but the oxide hardmask 14 has developed a severe angular aspect or facet 19.

The angular faceting of the hardmask is caused by argon sputtering within the HDP etching tool. Faceting of the hardmask 14 causes problems in maintaining pattern integrity as well as inadequate metal removal problems during a subsequent tungsten CMP(chemical mechanical polishing) process step. In quarter micron technology, the spacing between the metal lines 18 becomes small and the degradation of the hardmask 14 causes a high incidence of via shorts. The bowing phenomenon and the hardmask faceting phenomenon work against each other. Thus as the polymer profile bowing is reduced the hardmask faceting increases.

It would therefore be advantageous to remove the residual oxide hardmask after the via has been etched in the organic layer. Unfortunately, the aluminum conductive layer now lies exposed at the base of the via opening and is subject to damage and contamination if an aqueous etchant is used to remove the residual hardmask.

Havermann, U.S. Pat. No. 5,565,384 shows a method for placing a low-k organic insulative layer between conductors and forming a self-aligned via through a silicon oxide insulative layer which lies over the conductors and the organic layer. The silicon oxide layer forms the main body of the IMD layer and thereby also forms the main body of the via opening. It is relatively thick compared to the thickness of the organic layer. The organic layer serves to reduce the capacitance between the conductors on the same level but also acts as an etch stop for the silicon oxide via etch.

Maniar, et.al., U.S. Pat. No. 5,702,981 describes a method of forming a layer of silicon or aluminum nitride over a patterned conductor to act as a via etch stop and to prevent exposure of a vertical edge of the conductor caused by a mis-aligned via over etch. Woo, et.al., U.S. Pat. No. 5,451, 543 similarly uses an etch stop layer over a conductor for etching vias of different depths. The etch stop layer, which can be silicon nitride is chosen for its capacity to endure significant over-etch in a shallow via as a deeper via is etched.

SUMMARY OF THE INVENTION

It is an object of this invention to provide a method for the removal of residual hardmask material after the etching of via openings in an organic polymer IMD layer.

It is another object of this invention to provide a method for reducing the occurrence of via-to-via shorts for vias formed in organic polymer IMD layers.

It is yet another object of this invention to describe a method of forming a protective layer on a conductive layer which protects the conductive layer from damage by a plasma etch containing oxygen which is used to etch via openings in an organic polymer IMD layer overlying the conductive layer.

It is still another object of this invention to describe a method of forming a protective layer on a conductive layer which serves to protect the conductive layer from an aqueous acid dip etch used to remove residual hardmask material on an organic insulative layer in which via openings to said conductive layer have been formed.

These objects are accomplished by forming a thin protective layer on the surface of the conductive layer prior to the deposition of the organic polymer layer. The protective layer is chosen to be resistant to an aqueous etch which is subsequently used to remove the hardmask. The thin protective layer is deposited on the metal layer preferably before the conductive layer is patterned to form a wiring level. In this way the protective layer remains only over the conductive pattern and does not degrade the permittivity of the dielectric layer between the features of the pattern. The organic polymer layer is then formed and planarized, and a hardmask is patterned on the planarized organic polymer layer to define via openings to portions of the conductive pattern.

The via openings are then etched by an anisotropic plasma etch which terminates at the protective layer. The residual hardmask is then removed by an aqueous etchant which does not attack the protective layer at the base of the via opening. The protective layer is then removed by argon sputtering immediately prior to the deposition of barrier metal into the via openings. The protective layer removal and the barrier metal deposition are performed in the same tool and in the same pumpdown, thereby assuring a low conductivity, oxide free contact between the barrier material and the conductive pattern.

Alternatively the thin protective layer may be deposited after the conductive layer is patterned. This degrades the permittivity of the IMD layer between the features of the conductive pattern and could have a serious performance impact in high density circuits. However, this alternative is advantageous for reducing via misalignment problems and for protecting the edges of the metal pattern and the subjacent layer from moisture emanating from the organic layer during processing.

If silicon oxide is selected as the hardmask material, the protective layer is formed of silicon nitride or silicon oxynitride which are resistant to the dilute HF which is used to remove the residual hardmask. Alternately, the hardmask may be formed of silicon nitride or silicon oxynitride and the protective layer of silicon oxide. An etchant containing $H_3PO_4$ is then used to remove the hardmask.

DESCRIPTION OF THE PREFERRED EMBODIMENTS

Figure 1:
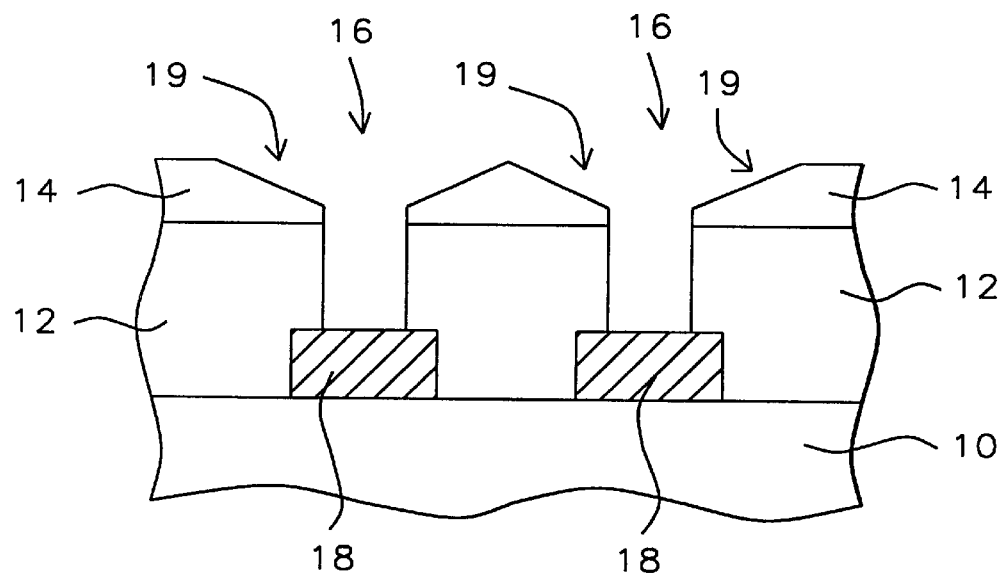
FIG. 1 is a cross section of a silicon wafer showing a hardmask damage hardmask after via openings are etched in an organic polymer layer.
Figure 2A:
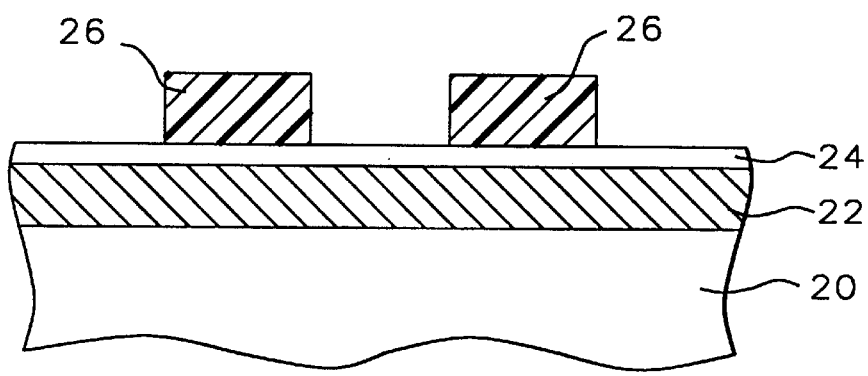
FIG. 2a through FIG. 2f are cross sections showing the sequence of process steps used to form vias in an organic polymer layer according to a first embodiment of this invention.

In a first embodiment of the current invention, a via between two conductive wiring levels is formed. An IMD layer which separates the two conductive wiring levels is formed of a low-k organic dielectric material, Referring to FIG. 2a, a 200 mm. silicon wafer with an insulative layer 20 is provided. Semiconductive devices(not shown) may be formed within the wafer surface by methods well known in the art. A conductive layer 22, preferably of aluminum or an alloy thereof is deposited over the insulative layer 20 by well known methods for forming conductive metal layers on integrated circuit wafers. A TiN BARC(bottom anti reflective coating) is applied (not shown) over the conductive layer 22. The BARC reduces reflections during photoresist exposure to assure sharp photolithographic images. A protective layer 24 of silicon nitride is next deposited on the conductive layer 22. Preferably by PECVD. The layer is deposited to a thickness of between about 100 and 400 Å. Alternatively, the layer 24 may comprise silicon oxynitride or another insulative material having a relatively high resistance to attack by aqueous HF when compared to silicon oxide.

Figure 2B:
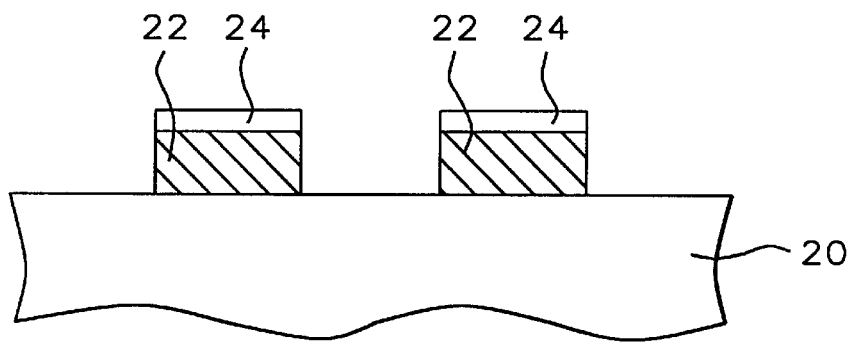

A layer of photoresist 26 is patterned on the protective layer 24 to define an interconnection wiring level which forms connections to the semiconductor elements by means of contacts (not shown) in the insulative layer 20. Methods for forming contacts are well know in the art. Referring now to FIG. 2b, the silicon nitride layer 24 is anisotropically plasma etched, preferably by RIE, using an etchant gas containing a fluorocarbon, for example, $CF_4$ and $O_2$. Alternately, a fluorocarbon-$H_2$ etchant gas may be used. The wiring pattern is then formed in the subjacent aluminum layer 22 by well known and widely practiced aluminum patterning methods, for example by anisotropically etching the aluminum layer 22 in a plasma containing $BCl_3$.

Figure 2C:
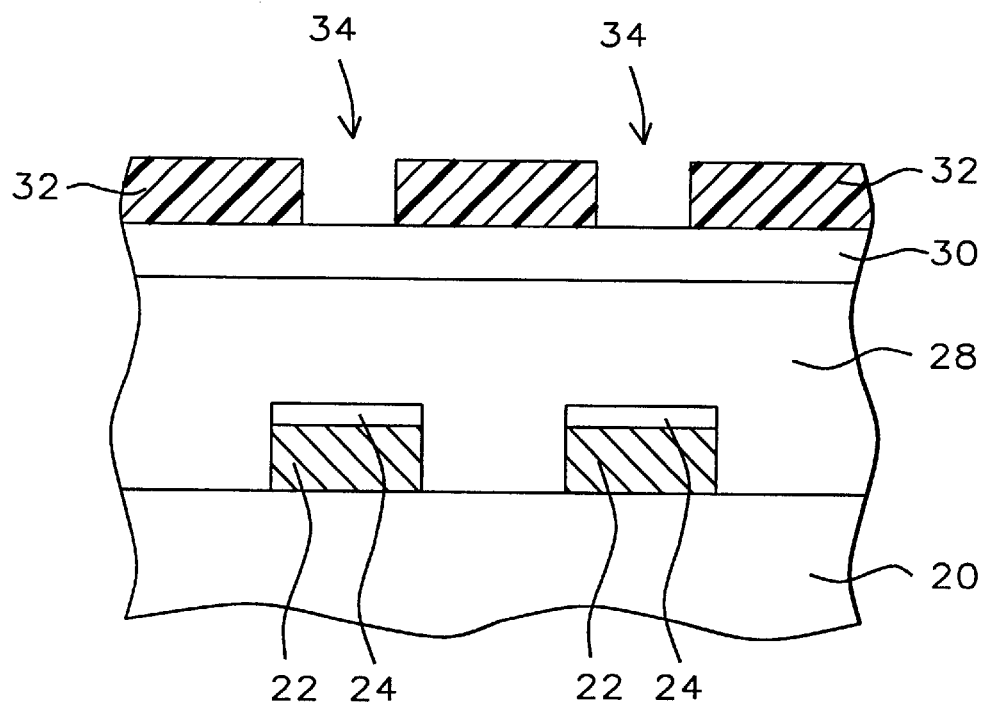

Referring now to FIG. 2c, a low-k organic IMD layer, for example an arylene ether polymer 28 is next formed over the insulative layer 20 and the patterned conductive layer 22. Precursors for arylene ether polymers such as various forms of FLARE or PAE are commercially available and are suitable for forming the organic IMD layer 28. The IMD layer 28 is formed by first depositing liquid arylene ether monomer onto the wafer from a nozzle as the wafer is spun on a wafer spinner. This method of film deposition is well known and widely practice for a great variety of applications such as the application of photoresists for photolithography and the application of spin-on-glasses for surface planarization. The thickness of the layer 28 is determined by the viscosity of the liquid monomer and the spinning speed of the wafer. After the deposition of the liquid, the film is dried and cured by thermal processing. The curing procedures are generally precursor specific and are well known to those in the art. In the current embodiment the thickness of the fully cured organic polymer layer 28 is preferably between about 0.7 and 1.0 microns thick. A thickness range between about 0.5 and 1.2 microns may also be successfully addressed by this invention.

The surface of the cured organic IMD layer 28 is next globally planarized by CMP and a layer of silicon oxide 30 is deposited on the organic layer 28 by PECVD. Other deposition means may alternately be used to deposit this layer. However, PECVD is preferred because of the low deposition temperature of this method. PECVD silicon oxide may be deposited at temperatures between 200 and 400° C. from $SiH_4/O_2$ or $SiH_4/N_2O$ precursors. The silicon oxide layer 30 is deposited to a thickness of 3,000 Å or thereabout.

A photoresist layer 32 in which via openings 34 are defined is next formed over the silicon oxide layer 30 using conventional photolithographic procedures.

The photoresist pattern 32 will be used to pattern the silicon oxide layer 30 to form a hardmask which, in turn, is used to etch vias in the subjacent organic layer 28. The utilization of a silicon oxide hardmask also permits the use of very thin photoresist layers (<0.8 microns thick) to pattern the hardmask, a requirement for the resolution of images of the order of 0.25 microns by DUV(deep ultraviolet) photolithography.

The wafer is loaded into the chamber of a dry etching tool capable of anisotropic plasma etching, for example, a high density plasma(HDP) parallel plate reactor. A suitable reactor is the model TCP-9100 manufactured by LAM Research Corporation. The reactor is of the parallel plate type and is fitted with an erodible plate, for example silicon or graphite bonded to a metal cathode. The etching tool provides the capability of controlling both the ion density(TCP) and the ion energy(BIAS) of the glow discharge.

The silicon oxide layer 30 is first patterned by RIE or anisotropic plasma etching to form a hardmask by using an etchant containing fluorocarbons, for example $CF_4$ or $CHF_3$. Anisotropic etching of silicon oxide is a well known procedure in the art. Since the photoresist is only required to endure the etching of the hardmask the resist layer may be of minimal thickness and therefore optimal for high resolution photolithography. The completion of the hardmask patterning is detected by optical emission spectroscopy, sensing endpoint by observation of the CO peak. Such endpoint detection methods are well known and widely practiced. After endpoint, the oxide etch is continued for a timed over-etch period of about 20%. This assures complete opening of the hardmask pattern.

The etchant gas is next changed to a mixture containing $O_2$ at a flow rate of between about 10 and 20 SCCM (standard cubic centimeters per minute) in a carrier gas of argon at a flow rate of between about 10 and 30 SCCM. Alternately a carrier gas of helium may be used. The flow rate of the carrier gas is adjusted to maintain a pressure of between about 10 and 20 mTorr in the reactor chamber. $CO_2$ in a argon or helium carrier gas has also been found effective for forming vias in organic polymer layers and may be alternatively be used for that purpose in this embodiment.

Figure 2D:
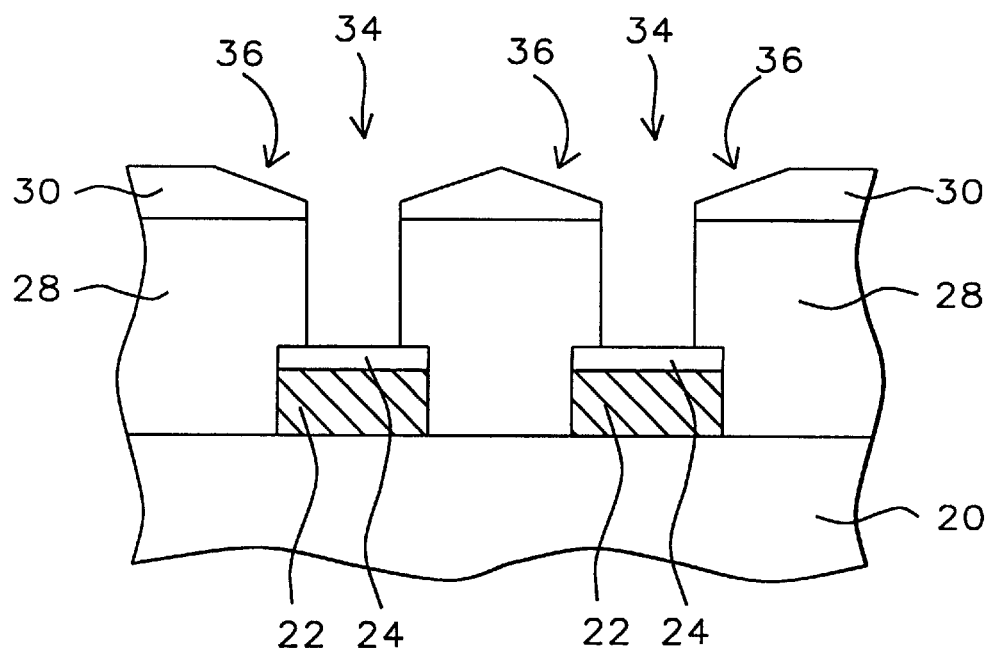

An rf discharge having a power of about 3,000 Watts TCP and about 300 Watts BIAS is struck in the etch chamber and the via openings 34 are etched in the organic polymer layer 28. Endpoint is determined by optical emission spectroscopy by observing the decay of a CO peak. Again an over etch period of about 30% is allowed to assure complete removal of organic polymer at the base of the via openings 34 exposing the silicon nitride protective layer 24 on the metal pattern 22. FIG. 2d shows a cross section of the via openings 34 after the IMD layer 28 etch. Any photoresist which remained after the silicon oxide hardmask patterning will also have been removed by the oxygen in the etchant, leaving only residual hardmask 30 exposed.

After the via openings 34 have been formed, the residual oxide hardmask is non-uniform and exhibits an angular aspect or faceting 36 at the edges of the via openings 34. This behavior is believed to be brought about by argon sputtering under the etching conditions which are required to produce optimal sidewall profiles of the via openings 34. The residual oxide hardmask is next removed by the application of a dip etching dilute aqueous HF, for example a 50:1 dilution of concentrated HF with water. The PECVD silicon oxide readily dissolves in the aqueous HF and the silicon nitride in the base of the via openings 34 protects the subjacent metal from attack.

The wafer is then transferred to a sputter deposition tool for barrier metal deposition. Prior to the deposition of a barrier layer, the wafer is subjected to a period of argon sputtering which removes the protective silicon nitride layer at the base of the via openings exposing the subjacent conductive wiring metal. Thus it is not necessary to use a separate process step to remove the protective layer after the hardmask has been removed. The in-situ pre-sputtering the wafer in argon not only removes the nitride layer but also assures a clean oxide-free metallic surface onto which the barrier metal becomes bonded.

Figure 2E:
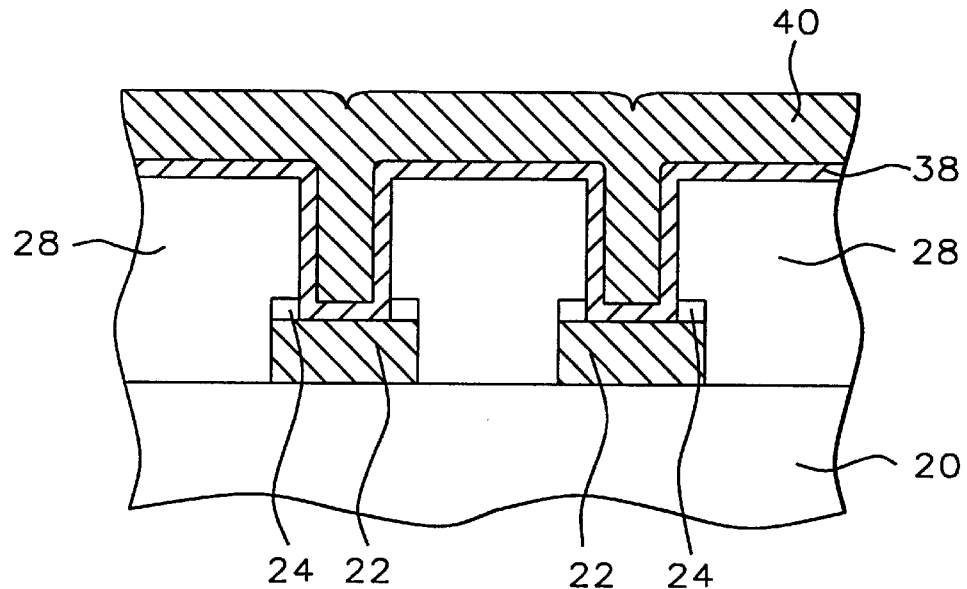

Referring now to FIG. 2e, a Ti/TiN adhesion/barrier layer 38 is sputter deposited forming a lining in the via openings 34.immediately after and in the same pumpdown as the argon pre-sputtering. The formation of adhesion/barrier layers is well known and The wafer is then removed from the sputtering tool and a tungsten layer 40 is deposited on the wafer using LPCVD, preferably by the silane reduction method using $SiH_4$ and $WF_6$. This deposition method is well known to those in the art and permits the deposition of W at temperatures between about 300° C. and 450° C. The tungsten layer 40 fills in the via openings 34 and blankets the entire wafer.

Figure 2F:
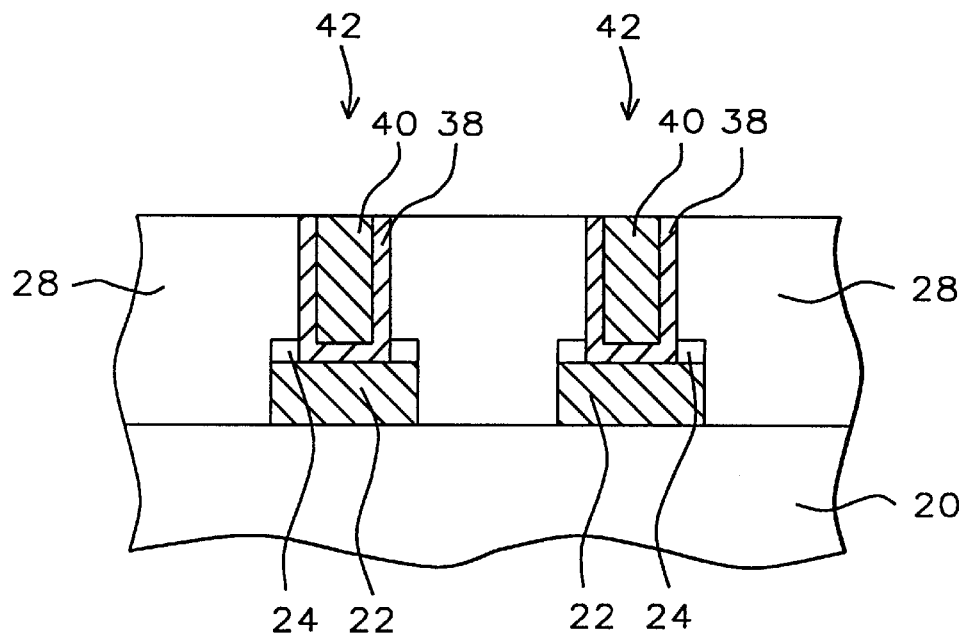

Referring to FIG. 2f, the tungsten layer 40 and the adhesion/barrier layer 38 are polished back to the IMD layer 28 surface by CMP thereby forming isolated vias 42. An alternate method, for example RIE etchback, may be used to anisotropically remove the tungsten layer 40 and the adhesion/barrier layer 38 to the surface of the IMD layer 28. Residual edges of the protective layer 24 remain adjacent to the vias. A second level of conductive wiring may now be patterned on the IMD layer 28.

In a second embodiment of the current invention, a via between two conductive wiring levels is formed. An IMD layer which separates the two conductive wiring levels is formed of a low-k organic dielectric material. The second embodiment differs from the first embodiment primarily in that the silicon nitride layer deposited to protect the conductive layer at the base of the via opening during the hardmask wet etch is formed after the conductive layer has been patterned. This degrades the permittivity of the IMD layer between the features of the conductive pattern. However, because the layer is relatively thin, the degradation is only slight. On the other hand, this alternative has several advantages. Firstly, it is helpful for reducing mis-alignment problems. The coverage of the edges of the aluminum pattern by the nitride layer protects them from exposure by over-etching of a mis-aligned via. Such exposure would not be properly covered by subsequently sputtered barrier metallurgy, and would suffer chemical attack by fluorides during a tungsten deposition. Another benefit is that the silicon nitride layer deposited after metal patterning, also protects the metal edges and components of the subjacent layer, from moisture or other contamination which may be emitted from the organic layer.

Figure 3A:
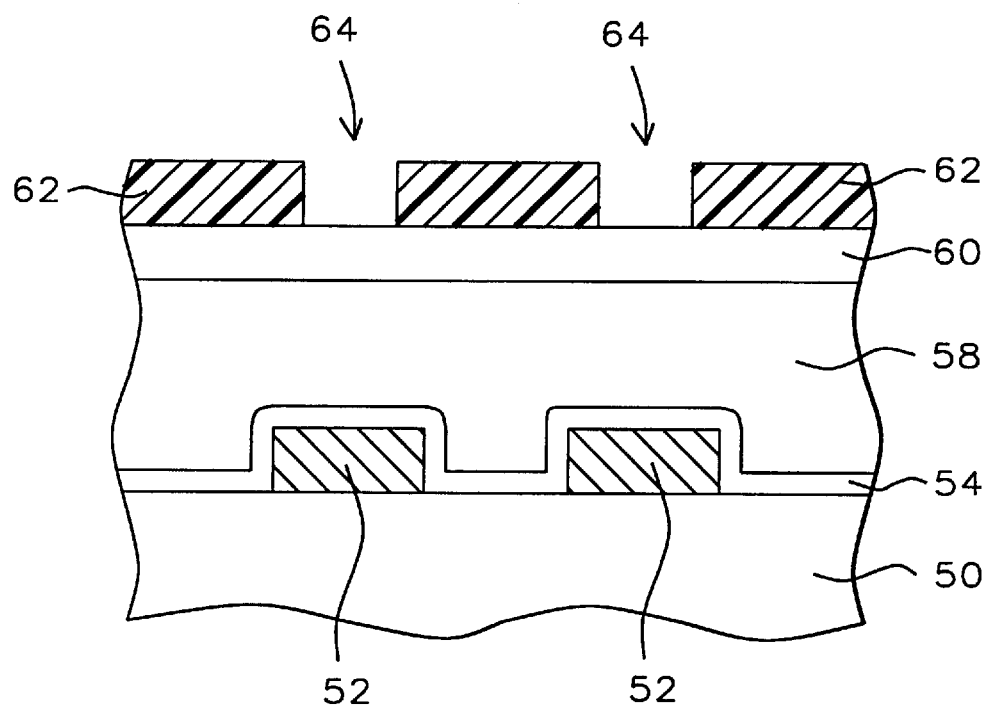
FIG. 3a through FIG. 3d are cross sections showing the sequence of process steps used to form vias in an organic polymer layer according to a second embodiment of this invention.

Referring to FIG. 3a, a 200 mm. silicon wafer with an insulative layer 50 is provided. Semiconductive devices(not shown) may be formed within the wafer surface by methods well known in the art. A conductive layer 52, preferably of aluminum or an alloy thereof is deposited over the insulative layer 50 and patterned by well known photolithographic methods to form a wiring level of an integrated circuit on the silicon wafer. An BARC(not shown) comprising a material such as TiN may be deposited over the aluminum layer to assure sharp photolithographic images.

A protective layer 54 of silicon nitride is next deposited over the conductive layer 52, preferably by PECVD. The layer is deposited to a thickness of between about 100 and 400 Å. Alternatively, the layer 54 may comprise silicon oxynitride or another insulative material having relatively high resistance to attack by aqueous HF when compared to silicon oxide.

A low-k organic IMD layer 58, for example an arylene ether polymer is next formed over the insulative layer 50 and the patterned conductive layer 54. Precursors for forming arylene ether polymers such as FLARE or PAE II are commercially available and are suitable for forming the organic IMD layer 58. The IMD layer 58 is formed by first depositing liquid arylene ether monomer onto the wafer from a nozzle as the wafer is spun on a wafer spinner. This method of film deposition is well known and widely practice for a great variety of applications such as the application of photoresists for photolithography and the application of spin-on-glasses for surface planarization. The thickness of the layer 58 is determined by the viscosity of the liquid monomer and the spinning speed of the wafer. After the deposition of the liquid, the film is dried and cured by thermal processing. The curing procedures are generally precursor specific and are well known to those in the art. In the current embodiment the thickness of the fully cured organic polymer layer 58 is preferably between about 0.7 and 1.0 microns thick. A thickness range between about 0.5 and 1.2 microns may also be successfully addressed by this invention.

The surface of the cured organic IMD layer 28 is next globally planarized by CMP and a layer of silicon oxide 60 is deposited on the organic layer 58 by PECVD. Other deposition means may alternately be used to deposit this layer. However, PECVD is preferred because of the low deposition temperature of this method. PECVD silicon oxide may be deposited at temperatures between 200 and 400° C. from $SiH_4/O_2$ or $SiH_4/N_2O$ precursors. The silicon oxide layer 60 is deposited to a thickness of 3,000 Å or thereabout.

A photoresist layer 62 in which via openings 64 are defined is next formed over the silicon oxide layer 60 using conventional photolithographic procedures. The photoresist pattern 62 will be used to form a silicon oxide hardmask which is then used to etch vias in the subjacent organic layer 58. The utilization of a silicon oxide hardmask also permits the use of very thin photoresist layers (<0.8 microns thick) to pattern the hardmask, a requirement for the resolution of images of the order of 0.25 microns by DUV(deep ultraviolet) photolithography.

The wafer is loaded into the chamber of a dry etching tool capable of anisotropic plasma etching, for example, a HOP parallel plate reactor. A suitable reactor is the model TCP-9100 manufactured by LAM Research Corporation. The reactor is of the parallel plate type and is fitted with an erodible plate, for example silicon or graphite bonded to a metal cathode. The etching tool provides the capability of controlling both the ion density(TCP) and the ion energy (BIAS) of the glow discharge.

The silicon oxide layer 60 is first patterned by RIE or anisotropic plasma etching to form a hardmask by using an etchant containing fluorocarbons, for example $CF_4$ or $CHF_3$. Anisotropic etching of silicon oxide is a well known procedure in the art. Since the photoresist is only required to endure the etching of the hardmask the resist layer may be of minimal thickness and therefore optimal for high resolution photolithography. The completion of the hardmask patterning is detected by using optical emission spectroscopy and sensing endpoint by observation of the CO peak. After endpoint, the oxide etch is continued for a timed over-etch period of about 30%. This assures complete opening of the hardmask pattern.

The etchant gas is next changed to a mixture containing $O_2$ at a flow rate of between about 10 and 30 SCCM in a carrier gas of argon at a flow rate of between about 10 and 30 SCCM. Alternately a carrier gas of helium may be used. The flow rate of the carrier gas is adjusted to maintain a pressure of between about 10 and 20 mTorr in the reactor chamber. $CO_2$ in a argon or helium carrier gas has also been found effective for forming vias in organic polymer layers and may be alternatively be used for that purpose in this embodiment.

Figure 3B:
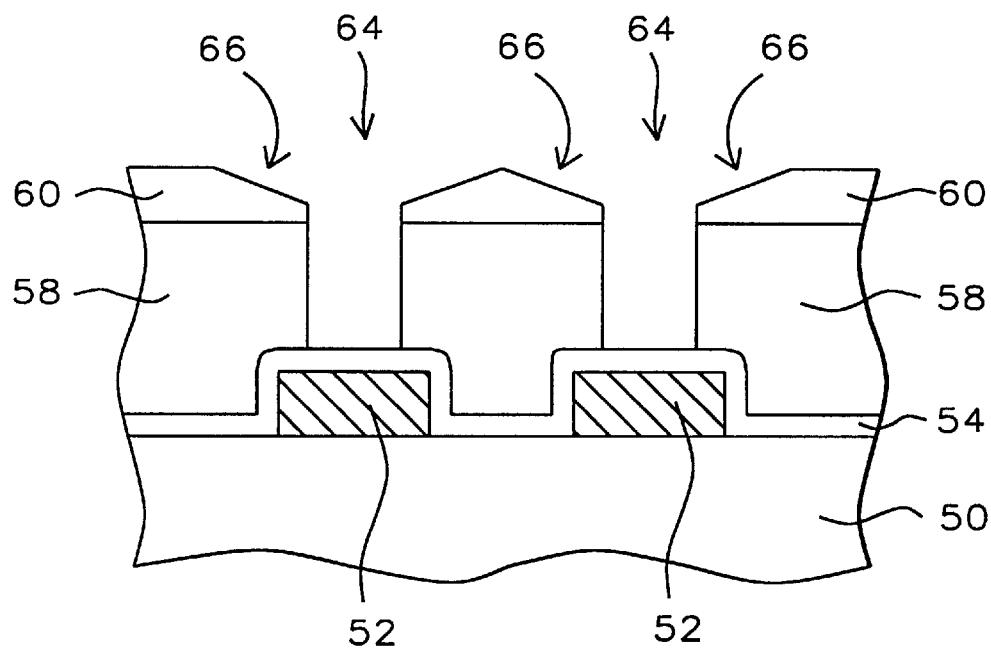

An rf discharge having a power of about 3,000 Watts TCP and about 300 Watts BIAS is struck in the etch chamber and the via openings 64 are etched in the organic polymer layer 58. Endpoint is determined by optical emission spectroscopy by observing the decay of a CO peak. An over etch period of about 30% is allowed to assure complete removal of organic polymer at the base of the via openings 64 exposing the silicon nitride protective layer 54 on the metal pattern 52. FIG. 3b shows a cross section of the via openings 64 after the IMD layer 58 etch. Any photoresist which remained after the silicon oxide hardmask patterning will also have been removed by the oxygen in the etchant, leaving only residual hardmask 60 exposed.

After the via openings 64 have been formed, the residual oxide hardmask is non-uniform and exhibits an angular aspect or faceting 66 at the edges of the via openings 64. This behavior is believed to be brought about by argon sputtering under the etching conditions which are required to produce optimal sidewall profiles of the via openings 64. The residual oxide hardmask is next removed by the application of a dip etching dilute aqueous HF, for example a 50:1 dilution of concentrated HF with water. The PECVD silicon oxide readily dissolves in the aqueous HF and the silicon nitride in the base of the via openings 64 protects the subjacent metal from attack.

The wafer is then transferred to a sputter deposition tool for barrier metal deposition. Prior to the deposition of a barrier layer, the wafer is subjected to a period of argon sputtering which removes the protective silicon nitride layer at the base of the via openings exposing the subjacent conductive wiring metal. Thus it is not necessary to use a separate process step to remove the protective layer after the hardmask has been removed. The in-situ pre-sputtering the wafer in argon not only removes the nitride layer bu also assures a clean oxide-free metallic surface onto which the barrier metal becomes bonded.

Figure 3C:
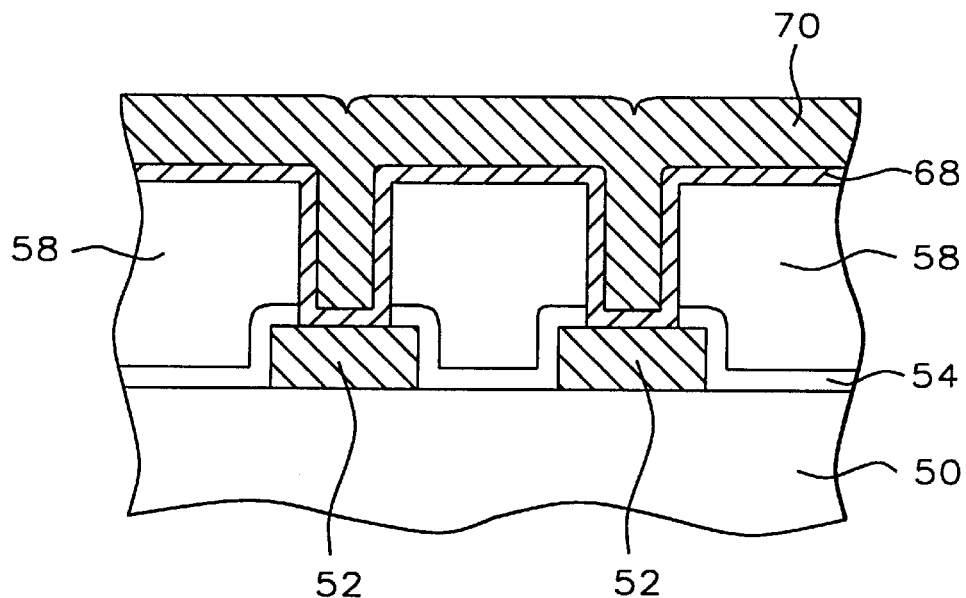

Referring now to FIG. 3c, a Ti/TiN adhesion/barrier layer 68 is sputter deposited forming a lining in the via openings 64.immediately after and in the same pumpdown as the argon pre-sputtering. The formation of adhesion/barrier layers is well known and The wafer is then removed from the sputtering tool and a tungsten layer 70 is deposited on the wafer using LPCVD, preferably by the silane reduction method using $SiH_4$ and $WF_6$. This deposition method is well known to those in the art and permits the deposition of tungsten at temperatures between about 300° C. and 450° C. The tungsten layer 70 fills in the via openings and blankets the entire wafer.

Figure 3D:
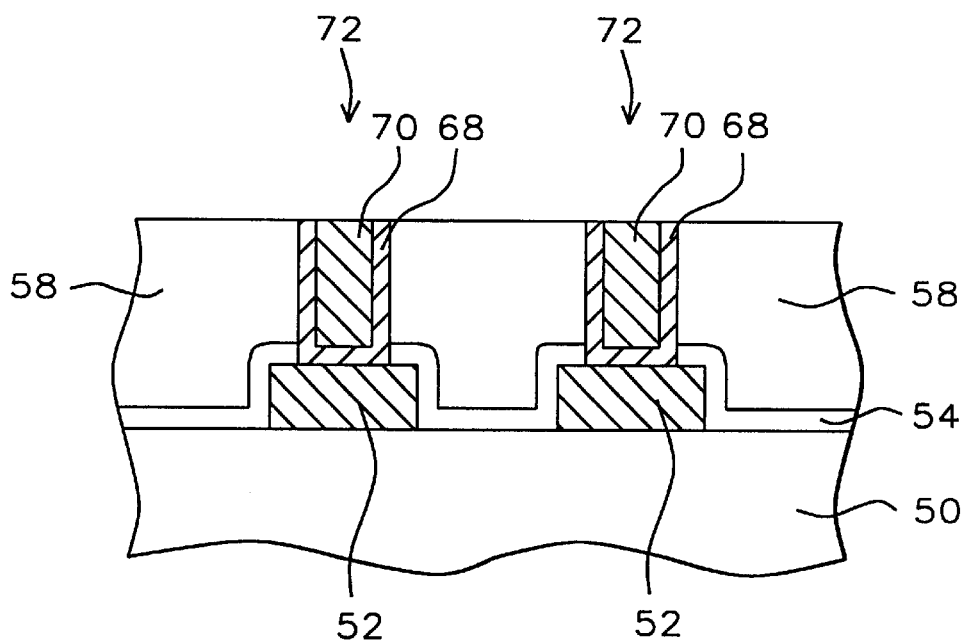

Referring to FIG. 3d, the tungsten layer 70 and the adhesion/barrier layer 68 are polished back to the IMD layer 58 surface by CMP thereby forming an isolated via 72. An alternate method, for example RIE etchback, may be used to anisotropically remove the tungsten layer 70 and the adhesion/barrier layer 68 to the surface of the IMD layer 58. Residual edges of the protective layer 24 remain adjacent to the vias. A second level of conductive wiring may now be patterned on the organic IMD layer 58.

The embodiments use a silicon wafer substrate. It should be well understood by those skilled in the art that other semiconductor substrates may also be used and, by applying the procedures taught by this invention, the same objectives may be achieved. While the invention has been particularly shown and described with reference to the preferred embodiments thereof, it will be understood by those skilled in the art that various changes in form and details may be made without departing from the spirit and scope of the invention.

The embodiments described employ a silicon oxide hardmask and a protective layer of silicon nitride or silicon oxynitride. The residual hardmask is removed by aqueous HF. The silicon nitride protective layer, which is resistant to the dilute HF etchant, protects the underlying metal from attack. The embodiments may alternately employ a hardmask formed of silicon nitride or of silicon oxynitride and a protective layer of silicon oxide. An etchant, containing $H_3PO_4$ is then used for hardmask removal. In the alternative the silicon oxide protective layer is resistant to the $H_3PO_4$ and therefore protects the underlying metal from etchant attack during hardmask removal.

Although the embodiments are applied to poly(arylene ether) dielectric layers other low-k organic polymer materials are also contemplated by this invention. In addition other deposition methods for such low-k organic materials such as vapor deposition may be used without departing from the spirit and scope of the invention.

What is claimed is:

1. A method for forming a via on a semiconductor wafer comprising:
   (a) providing a semiconductor wafer having a first conductive layer;
   (b) forming a protective layer of a first material on said conductive layer;
   (c) patterning said protective layer and said first conductive layer;
   (d) forming a organic polymer layer on said wafer;
   (e) forming a hardmask of a second material defining an opening on said organic polymer layer;
   (f) anisotropically etching said organic polymer layer in a parallel plate high density plasma reactor, thereby forming said opening in said organic polymer layer exposing a region of said protective layer, and whereby said hardmask becomes faceted and non-uniform;
   (g) removing residual said hardmask with an aqueous etchant;
   (h) removing said protective layer in said opening by sputter etching in Argon, thereby exposing said first conductive layer;
   (i) directly after said sputter etching, and without breaking vacuum, depositing an adhesion/barrier layer in said opening;
   (j) depositing a second conductive layer on said wafer; and
   (k) planarizing said wafer thereby removing planar portions of said second conductive layer and said adhesion/barrier layer, leaving a conductive plug in said opening, said plug comprising a via.

2. The method of claim 1 wherein said protective layer is deposited at thickness of between about 100 and 400 Angstroms.

3. The method of claim 1 wherein said organic polymer layer is taken from the group consisting of a poly(arylene ether) and a polyimide.

4. The method of claim 1 wherein said first material is selected from the group containing silicon nitride and silicon oxynitride, said second material is silicon oxide, and said aqueous etchant is HF.

5. The method of claim 1 wherein said first material comprises silicon oxide, said second material is selected from the group containing silicon nitride and silicon oxynitride, and said aqueous etchant is $H_3PO_4$.

6. A method for forming a via on a semiconductor wafer comprising:
   (a) providing a semiconductor wafer having a first conductive layer on an insulative layer;
   (b) patterning said first conductive layer, thereby forming a conductive pattern;
   (c) forming a protective layer of a first material over said conductive pattern;
   (d) forming a organic polymer layer over said protective layer;
   (e) forming a hardmask of a second material defining an opening over said organic polymer layer;
   (f) anisotropically etching said organic polymer layer in a parallel plate high density plasma reactor, thereby forming said opening in said organic polymer layer, exposing a region of said protective layer, and whereby said hardmask becomes faceted and non-uniform;
   (g) removing residual said hardmask with an aqueous etchant;
   (h) removing said protective layer in said opening by sputter etching with argon, thereby exposing said first conductive layer;
   (i) directly after said sputter etching, and without breaking vacuum, depositing an adhesion/barrier layer in said opening;
   (j) depositing a second conductive layer on said wafer; and (k) planarizing said wafer thereby removing planar portions of said second conductive layer and said adhesion/barrier layer, leaving a conductive plug in said opening, said plug comprising a via.

7. The method of claim 6 wherein said protective layer is deposited at thickness of between about 100 and 400 Angstroms.

8. The method of claim 6 wherein said organic polymer layer is taken from the group consisting of a poly(arylene ether) and a polyimide.

9. The method of claim 6 wherein said first material is selected from the group containing silicon nitride and silicon oxynitride, said second material is silicon oxide, and said aqueous etchant is HF.

10. The method of claim 6 wherein said first material comprises silicon oxide, said second material is selected from the group containing silicon nitride and silicon oxynitride, and said aqueous etchant is $H_3PO_4$.

* * * * *